US010811070B2

(12) United States Patent
Tomose

(10) Patent No.: US 10,811,070 B2
(45) Date of Patent: Oct. 20, 2020

(54) MEMORY SYSTEM AND CONTROL METHOD TO PERFORM PATROL READ OPERATION

(71) Applicant: TOSHIBA MEMORY CORPORATION, Minato-ku, Tokyo (JP)

(72) Inventor: Koji Tomose, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/372,699

(22) Filed: Apr. 2, 2019

(65) Prior Publication Data

US 2020/0090725 A1 Mar. 19, 2020

(30) Foreign Application Priority Data

Sep. 13, 2018 (JP) .................................. 2018-171775

(51) Int. Cl.
*G11C 11/16* (2006.01)
*G06F 3/06* (2006.01)

(52) U.S. Cl.
CPC ........ *G11C 11/1675* (2013.01); *G06F 3/0604* (2013.01); *G06F 3/0658* (2013.01); *G06F 3/0673* (2013.01); *G11C 11/1673* (2013.01)

(58) Field of Classification Search
CPC ............. G11C 11/1675; G11C 11/1673; G06F 3/0658; G06F 3/0673; G06F 3/0604
See application file for complete search history.

(56) References Cited

U.S. PATENT DOCUMENTS

| 9,594,611 B2 | 3/2017 | Hashimoto | |
|---|---|---|---|
| 2006/0103547 A1* | 5/2006 | Salser, Jr. | ................ H04Q 9/00 340/870.02 |
| 2015/0261604 A1* | 9/2015 | Sugiyama | .............. G11C 29/52 714/764 |
| 2016/0239381 A1* | 8/2016 | Nakazumi | ........... G06F 11/1072 |
| 2016/0259698 A1 | 9/2016 | Kanno et al. | |
| 2017/0062034 A1 | 3/2017 | Bandic et al. | |
| 2017/0262198 A1 | 9/2017 | Nakata et al. | |

\* cited by examiner

*Primary Examiner* — Sultana Begum
(74) *Attorney, Agent, or Firm* — Foley & Lardner LLP

(57) ABSTRACT

A memory system including an MRAM; a memory controller; a temperature sensor; and a magnetic sensor. In the MRAM, write/erase count information, patrol read execution time information, and patrol read information defining a patrol read execution time interval for combinations of a temperature, an intensity of a magnetic field, and a write/erase count are stored. The memory controller acquires the temperature from the temperature sensor, acquires the intensity of the magnetic field from the magnetic sensor, acquires from the patrol read information the patrol read execution time interval corresponding to the combination of the temperature, the intensity of the magnetic field, and the write/erase count, and determines whether or not a patrol read shall be executed by comparing the elapsed time from the previous patrol read execution time with the acquired patrol read execution time interval.

20 Claims, 4 Drawing Sheets

FIG. 4

| TEMPERATURE | MAGNETIC FIELD | WRITE/ERASE COUNT | | | | |
|---|---|---|---|---|---|---|
| | | 0~229 | 300~600 | 600~900 | 900~1.2K | ... |
| HIGH | HIGH | 2 | 1.5 | 1 | 0.5 | ... |
| HIGH | INTERMEDIATE | 4 | 3.5 | 3 | 2.5 | ... |
| HIGH | LOW | 8 | 7.5 | 7 | 6.5 | ... |
| ROOM TEMPERATURE | HIGH | 6 | 5.5 | 5 | 4.5 | ... |
| ROOM TEMPERATURE | INTERMEDIATE | 7 | 6.5 | 6 | 5.5 | ... |
| ROOM TEMPERATURE | LOW | 8 | 7.5 | 7 | 6.5 | ... |
| LOW | HIGH | 6 | 4.5 | 4 | 3.5 | ... |
| LOW | INTERMEDIATE | 9 | 8.5 | 8 | 7.5 | ... |
| LOW | LOW | 10 | 9.5 | 9 | 8.5 | ... |

MEMORY SYSTEM AND CONTROL METHOD TO PERFORM PATROL READ OPERATION

CROSS-REFERENCE TO RELATED APPLICATION

This application is based upon and claims the benefit of priority from Japanese Patent Application No. 2018-171775, filed Sep. 13, 2018, the entire contents of which are incorporated herein by reference.

FIELD

Embodiments described herein relate generally to a memory system and a control method of a memory system.

BACKGROUND

In a memory system using a NAND flash memory (hereinafter, referred to as a NAND memory) as a storage medium, a patrol read is performed to verify reliability of data. As a result, if an occurrence of an error due to data retention is detected, a refresh process is performed.

A memory system using a magnetoresistive random access memory (hereinafter, referred to as an MRAM) as a storage medium is not proposed. In addition, in such memory system, there is a concern that an error may occur due to data retention after receiving influence from an external environmental temperature and an external environmental magnetic field.

DESCRIPTION OF THE DRAWINGS

FIG. 4 is a table illustrating an example of the patrol read information according to at least one embodiment.

DETAILED DESCRIPTION

At least one embodiment provides a memory system using an MRAM as a storage medium capable of reducing data loss due to data retention, and a control method of a memory system.

In general, according to at least one embodiment, a memory system includes: an MRAM; a memory controller for controlling access of data to the MRAM; a temperature sensor for measuring a temperature of the memory system; and a magnetic sensor for measuring an intensity of a magnetic field of the memory system. In the MRAM, write/erase count information indicating the write/erase count of the MRAM, patrol read execution time information including the previous patrol read execution time, and patrol read information defining a patrol read execution time interval for combinations of a temperature, an intensity of a magnetic field, and the write/erase count are stored. The memory controller acquires the temperature from the temperature sensor, acquires the intensity of the magnetic field from the magnetic sensor, acquires the patrol read execution time interval corresponding to this combination of the temperature, the intensity of the magnetic field, and the write/erase count from the patrol read information, and determines whether or not a patrol read shall be executed by comparing the elapsed time from the previous patrol read execution time with the acquired patrol read execution time interval.

Hereinafter, a memory system and a control method of a memory system according to at least one embodiment will be described in detail with reference to the drawings. The present disclosure is not limited to the embodiments.

Figure 1:
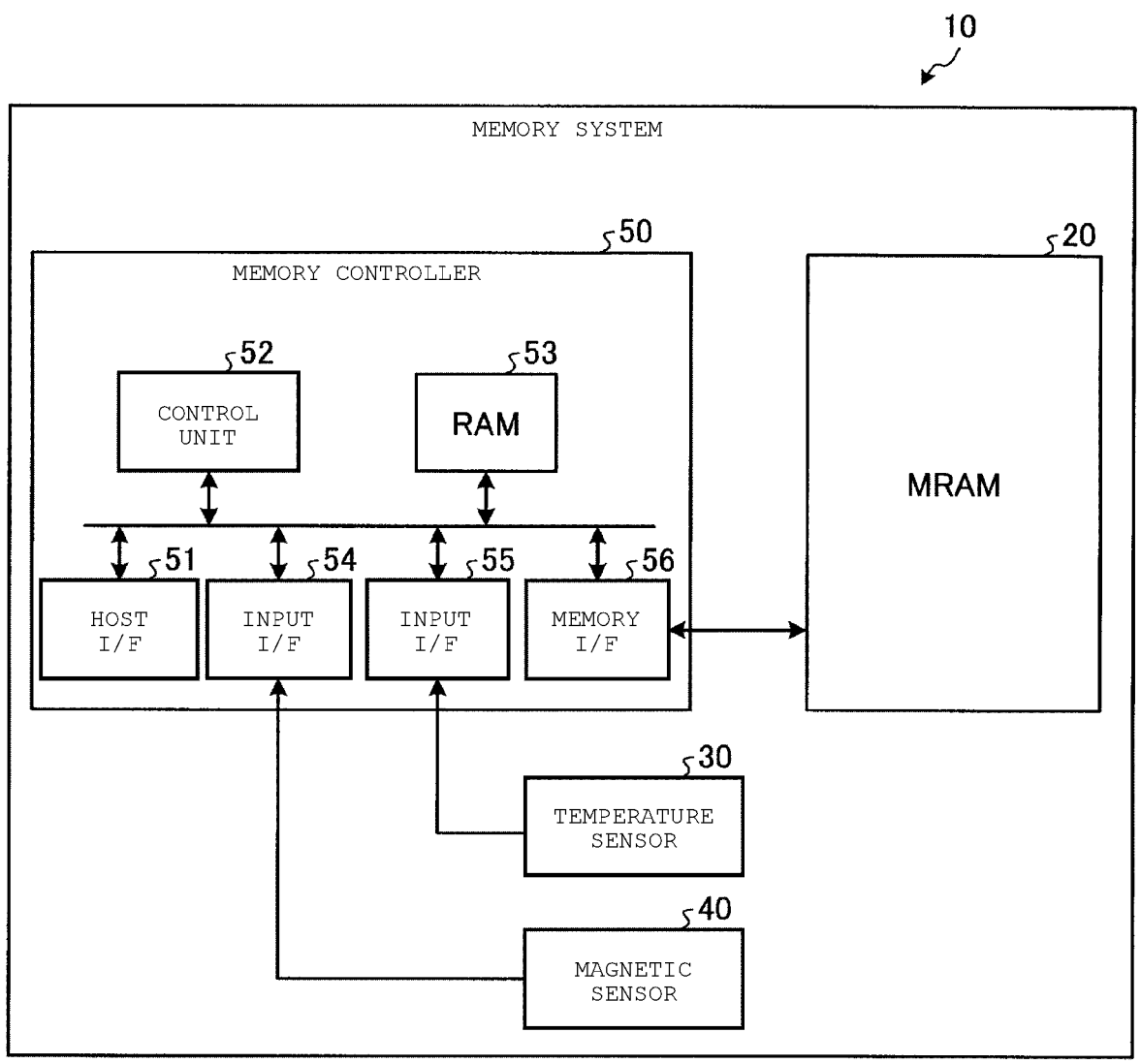
FIG. 1 is a block diagram schematically illustrating an example of a configuration of a memory system according to at least one embodiment.

FIG. 1 is a block diagram schematically illustrating an example of a configuration of the memory system according to at least one embodiment. A memory system 10 includes an MRAM 20 as a nonvolatile memory, a temperature sensor 30, a magnetic sensor 40, and a memory controller 50. The memory system 10 is capable of connecting to a host (not illustrated). The host is, for example, an electronic device such as a personal computer or a portable terminal.

The MRAM 20 is a memory capable of holding written data even in a state where power is not supplied. The MRAM 20 is configured with one or more MRAM chips having a memory cell array. The memory cell array is formed by arranging a plurality of memory cells in a matrix configuration. Each memory cell array is formed by arranging a plurality of physical blocks, which are units of erasing, into an array.

Figure 2:
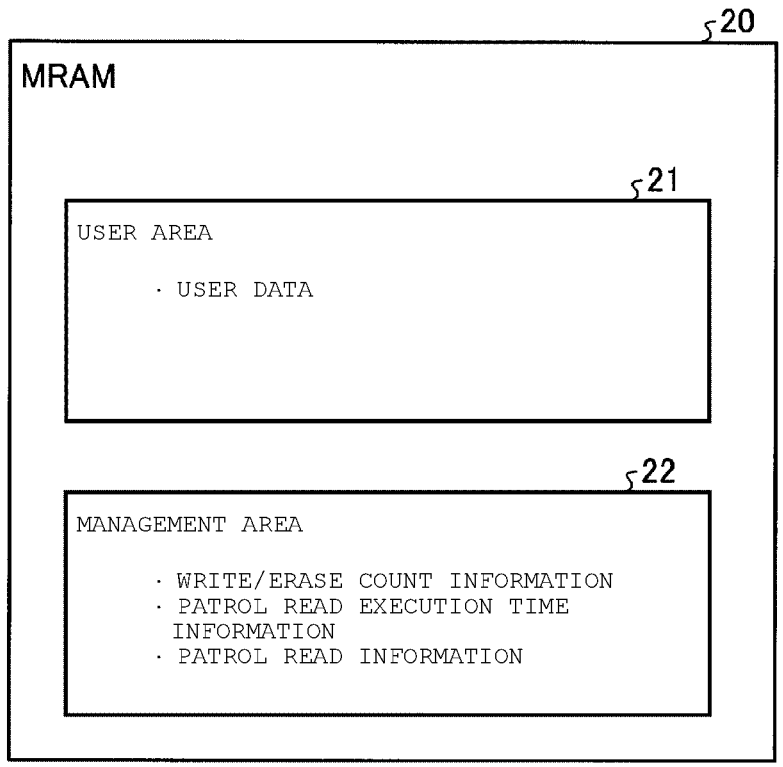
FIG. 2 is a diagram illustrating an example of a configuration of a storage region of an MRAM.

FIG. 2 is a diagram illustrating an example of a configuration of a storage region of the MRAM. The MRAM 20 is provided with a user area 21 for storing user data transmitted from the host and a management area 22 for storing management information used for management of the memory system 10. As the management information used in at least one embodiment, write/erase count information, patrol read execution time information, and patrol read information are stored in the management area 22.

The write/erase count information is information in which, for example, the write/erase count which is a write count to a memory cell or an erase count of a block is recorded for each block. The patrol read execution time information is information including a time at which the patrol read is last executed. The patrol read is a process of periodically reading data from the MRAM 20 and determining whether there are errors in the read data in order to detect accumulation of errors mainly due to data retention before the errors cannot be corrected.

The patrol read information is information specifying a combination of the temperature, the intensity of a magnetic field, and the write/erase count, and the execution time interval of the patrol read. If the execution time interval of the patrol read is shortened, a delay occurs in the process of the memory system 10 due to an instruction from the host. Therefore, the execution time interval of the patrol read is set so as not to affect the performance of the memory system 10. The execution time interval varies with the combination of the temperature, the intensity of the magnetic field, and the write/erase count.

For example, if the memory system 10 is under a high temperature environment higher than room temperature or under a high magnetic field environment higher than terrestrial magnetism, the memory cell of the MRAM 20 is affected by an environmental temperature or an environmental magnetic field, and a possibility of the memory cell receiving energy exceeding information holding energy is increased. That is, a probability of an error caused by the data retention becomes high. Therefore, in such a case, it is desirable to frequently perform the patrol read. On the other hand, if the memory system 10 is under an environment of room temperature or less, or under an environmental magnetic field of the same as that of the terrestrial magnetism, the memory cell of the MRAM 20 is unlikely to be affected by the environment temperature or the environment magnetic field. That is, the probability of an error caused by the data retention becomes relatively low. Therefore, in such a case, the execution time interval of the patrol read may be shortened. In addition, if the write/erase count increases, the probability of the error caused by the data retention increases, so that it is desirable to shorten the execution time interval of the patrol read as compared with a case where the write/erase count is small.

Figure 3:
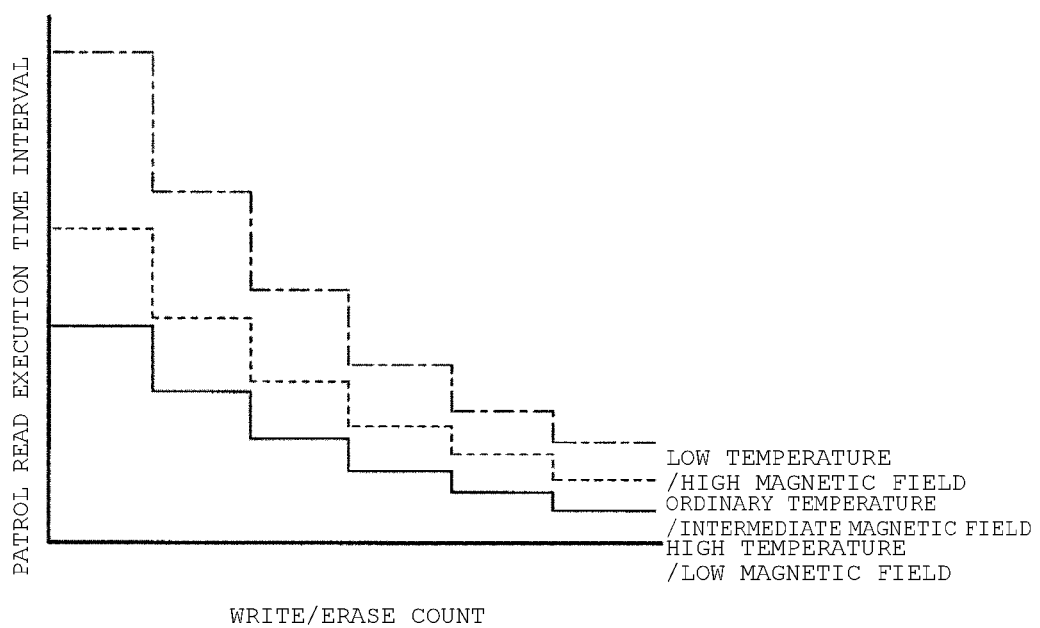
FIG. 3 is a graph illustrating an outline of an execution time interval of a patrol read according to a temperature, an intensity of a magnetic field, and a write/erase count according to at least one embodiment.

FIG. 3 is a graph illustrating an outline of the execution time interval of the patrol read according to the temperature, the intensity of the magnetic field, and the write/erase count according to the embodiment. In the graph, a horizontal axis indicates the write/erase count and a vertical axis indicates the execution time interval of the patrol read. In FIG. 3, as an example, a case of a low magnetic field at a low temperature, a case of an intermediate magnetic field at ordinary temperature, and a case of a high magnetic field at a high temperature are illustrated. The ordinary temperature is a temperature range around room temperature (approximately 25° C.), and the low temperature is a temperature range lower than the ordinary temperature and is, for example, a temperature range of 0° C. to 25° C. The high temperature is a temperature range higher than the ordinary temperature and is, for example, a temperature range exceeding 60° C. In addition, when an interval between an intensity of the magnetic field which is substantially the same as the terrestrial magnetism, and an intensity of the magnetic field capable of giving the same energy as the information holding energy to the memory cell is divided into three ranges, for example, the three divided ranges are called the high magnetic field, the intermediate magnetic field, and the low magnetic field in the order from the strongest magnetic field.

As the write/erase count gets smaller, the execution time interval of the patrol read gets longer, and as the write/erase count gets longer, the execution time interval of the patrol read gets shorter. In addition, as the temperature gets higher, or as the magnetic field gets stronger, the execution time interval of the patrol read gets shorter.

FIG. 4 is a table illustrating an example of the patrol read information according to at least one embodiment. In the patrol read information, the patrol read execution time interval is set for each combination of the temperature, the intensity of the magnetic field, and the write/erase count. The patrol read execution time interval is set in accordance with a trend illustrated in FIG. 3. For example, the time of an error due to data retention for each combination of temperature, intensity of the magnetic field, and write/erase count is obtained experimentally, and a time shorter than the obtained time is set as the patrol read execution time interval.

The temperature sensor 30 measures the temperature of the memory system 10 and outputs the measured temperature to the memory controller 50 in response to a request from the memory controller 50. As the temperature sensor 30, a resistance temperature detector, a thermistor, a thermocouple or the like is used.

The magnetic sensor 40 measures the magnetic field at a location where the memory system 10 is disposed and outputs the intensity of the measured magnetic field to the memory controller 50 in response to a request from the memory controller 50. As the magnetic sensor 40, a Hall element, a magnetoresistive element or the like is used.

The memory controller 50 controls the MRAM 20 to write data based on a write command (write request) from the host. In addition, the memory controller 50 controls the MRAM 20 to read data based on a read command (read request) from the host. The memory controller 50 includes a host interface (host I/F) 51, a control unit 52, a random access memory (RAM) 53, input interfaces (input I/Fs) 54 and 55, and a memory interface (memory I/F) 56. The host I/F 51, the control unit 52, the RAM 53, the input I/Fs 54 and 55, and the memory I/F 56 are connected to an internal bus 57.

The host I/F 51 performs a process according to an interface standard with the host, and outputs a command, user data, or the like received from the host to the internal bus 57. In addition, the host I/F 51 transmits user data read from the MRAM 20, a response from the control unit 52, or the like to the host.

The control unit 52 is a function unit that comprehensively controls each configuration element of the memory controller 50. When receiving a command (command, request) from the host via the host I/F 51, the control unit 52 controls each configuration element of the memory controller 50 based on the command.

For example, the control unit 52 controls the memory I/F 56 based on a command (write command) from the host and instructs the MRAM 20 to write data. In addition, the control unit 52 controls the memory I/F 56 based on a command (read command) from the host and instructs the MRAM 20 to read data.

When receiving a write request from the host, the control unit 52 determines a storage region (memory region) on the MRAM 20 for the user data accumulated in the RAM. That is, the control unit 52 manages a write destination of the user data. A list of correspondences, between a logical address of the user data received from the host and a physical address indicating the storage region on the MRAM 20 in which the user data is stored, is stored as an address conversion table which is an example of management information.

In addition, when the memory system 10 starts up or when a request (idle request) for transition to the idle state from the host is received, the control unit 52 determines whether or not the patrol read shall be executed, according to the write/erase count, the temperature, and the intensity of the magnetic field of the MRAM 20. The control unit 52 acquires the temperature and the intensity of the magnetic field from the temperature sensor 30 and the magnetic sensor 40 via the input I/Fs 54 and 55, and acquires the write/erase count information and the patrol read execution time information from the management area 22 of the MRAM 20. In addition, the control unit 52 acquires the patrol read execution time interval corresponding to the combination of the temperature, the intensity of the magnetic field, and the write/erase count from the patrol read information. If the elapsed time from the time when the previous patrol read is executed is larger than the acquired patrol read execution time interval, the control unit 52 executes the patrol read of the MRAM 20. If as a result of executing the patrol read there is an error in the data of the MRAM 20, the control unit 52 executes a refresh process of rewriting the data to a separate location after carrying out an error correction process. Moreover, if the elapsed time is shorter than the patrol read execution time interval, or if there is no error in the data of the MRAM 20, the control unit 52 executes a separate background process.

As a separate background process, garbage collection (that is, compaction), wear leveling, or the like is exemplified. The garbage collection is, for example, a process of gathering valid data from a plurality of active blocks including valid data and invalid data, rewriting the valid data into a separate block, allocating a free block, and increasing usable blocks. The active block is a block in which the valid data is stored. The free block is a block in which the valid data is not stored, and is a block that may be reused as an erased block after erasing. The wear leveling is, for example, a process of leveling the number of times of rewriting performed on the blocks of the MRAM 20 by replacing data stored in a block having a large number of the write/erase count with data stored in a block having a small number of the write/erase count.

The RAM 53 temporarily stores the user data received from the host until the user data is stored in the MRAM 20 by the memory controller 50. In addition, the RAM 53 temporarily stores the user data read from the MRAM 20 until the user data is transmitted to the host via the host I/F 51. Furthermore, when the control unit 52 is determining whether or not the patrol read shall be executed, the RAM 53 temporarily stores the temperature and the intensity of the magnetic field output from the temperature sensor 30 and the magnetic sensor 40. The RAM 53 is, for example, a general-purpose memory such as a static RAM (SRAM) or a dynamic RAM (DRAM).

The input I/Fs 54 and 55 convert analog signals input from the temperature sensor 30 and the magnetic sensor 40 connected to the memory controller 50 into digital signals, and output the digital signals to the internal bus 57.

The memory I/F 56 instructs the MRAM 20 to write data under the control of the control unit 52. In addition, the memory I/F 56 instructs the MRAM 20 to read data under the control of the control unit 52.

Figure 5:
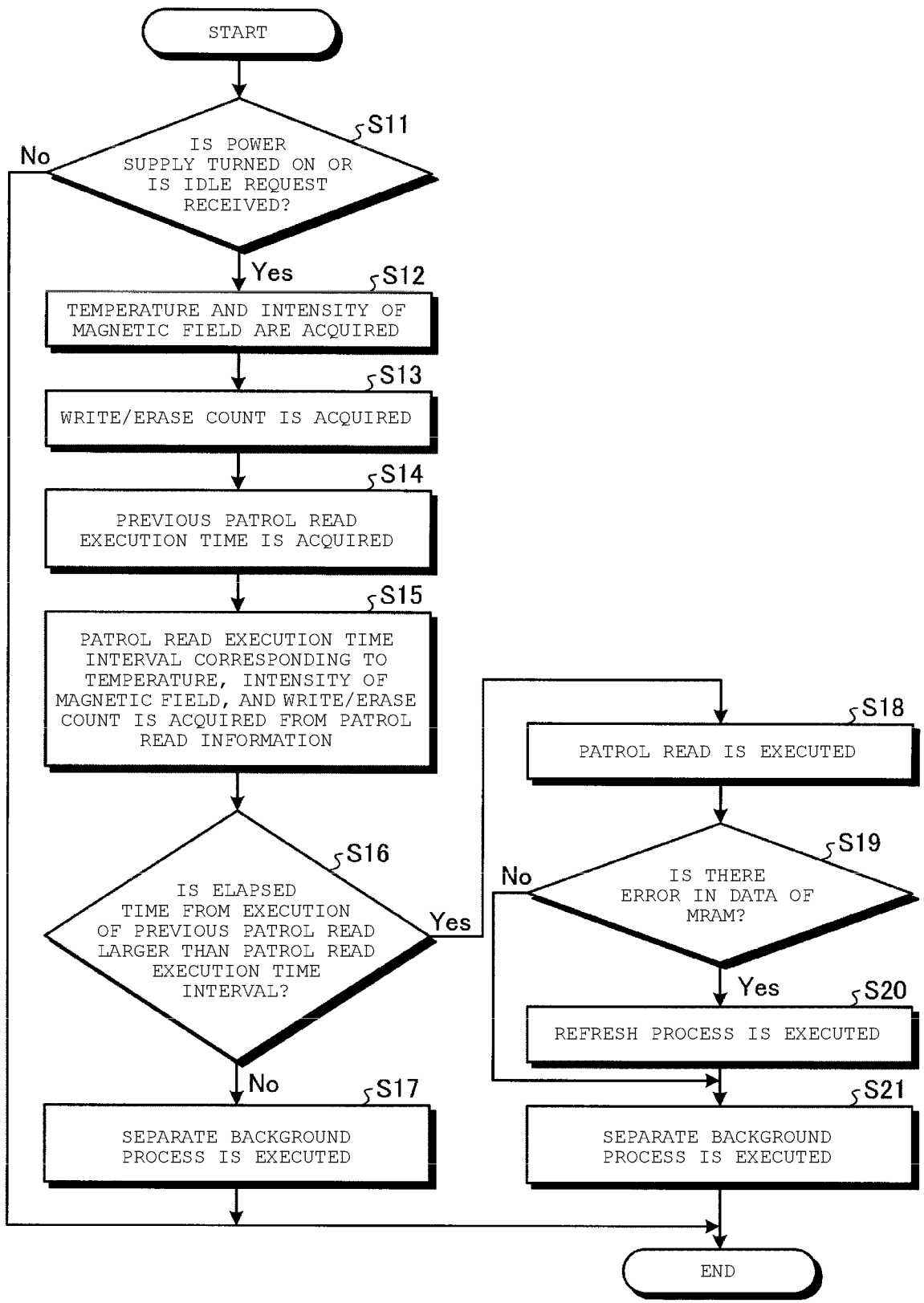
FIG. 5 is a flowchart illustrating an example of the control method of the memory system according to at least one embodiment.

Next, a control method for executing the patrol read in the memory system 10 having such a configuration will be described. FIG. 5 is a flowchart illustrating an example of the control method of a memory system according to at least one embodiment. First, the memory controller 50 determines whether a power supply of the memory system 10 is turned on or the idle request from the host is received (step S11). When the power supply is not turned on or the idle request from the host is not received (No in step S11), a process related to the execution of the patrol read is not performed and the process is terminated.

On the other hand, when the power supply is turned on or the idle request from the host is received (Yes in step S11), the memory controller 50 acquires the temperature from the temperature sensor 30 and the intensity of the magnetic field from the magnetic sensor 40 (step S12).

In addition, the memory controller 50 acquires the write/erase count from the write/erase count information of the MRAM 20 (step S13). Since the write/erase count information is, for example, information indicating the write/erase count for each block of the MRAM 20, the memory controller 50 calculates, for example, an average value of the write/erase count information and makes the average value the write/erase count of the MRAM 20. Alternatively, any one of a most frequent value, an intermediate value, a maximum value, and a minimum value in the write/erase count information may be made the write/erase count of the MRAM 20. Moreover, when the wear leveling for leveling the write/erase count for each block is performed, the write/erase count of each block is close to the average value.

In addition, the memory controller 50 acquires the previous patrol read execution time from the patrol read execution time information of the MRAM 20 (step S14). Subsequently, the memory controller 50 acquires the patrol read execution time interval corresponding to the combination of the acquired temperature, the intensity of the magnetic field, and the write/erase count from the patrol read information (step S15). Moreover, as illustrated in FIGS. 3 and 4, the acquired patrol read execution time interval varies in response to the combination of the temperature, the intensity of the magnetic field, and the write/erase count, and is not the same patrol read execution time interval each time.

Thereafter, the memory controller 50 determines whether the elapsed time from the execution of the previous patrol read is larger than the acquired patrol read execution time interval (step S16). If the elapsed time is smaller than the patrol read execution time interval (No in step S16), it is not necessary to execute the patrol read, so that the memory controller 50 executes a separate background process (step S17). As a separate background process, garbage collection or wear leveling is exemplified. Then, the process is terminated.

In addition, if the elapsed time is larger than the patrol read execution time interval (Yes in step S16), the memory controller 50 executes the patrol read (step S18). The patrol read is a process of determining whether data stored in the MRAM 20 can be accurately read.

As a result of the execution of the patrol read, the memory controller 50 determines whether there is an error in the data of the MRAM 20 (step S19). If there is an error in the data of the MRAM 20 (Yes in step S19), the memory controller 50 executes the refresh process (step S20). In the refresh process, the memory controller 50 corrects the error-containing data by an error correction process and rewrites the data to a separate location.

If there is no error in the data of the MRAM 20 (No in step S19), the memory controller 50 does not execute the refresh process. Thereafter, or after step S20, the memory controller 50 executes a separate background process (step S21) and the process is terminated.

In at least one embodiment, the memory system 10 using the MRAM 20 as the storage medium is provided with the temperature sensor 30 and the magnetic sensor 40. In addition, when the power supply of the memory system 10 is turned on or when the idle request is received, the memory controller 50 acquires the temperature and the intensity of the magnetic field from the temperature sensor 30 and the magnetic sensor 40, and acquires the write/erase count and the previous patrol read execution time of the MRAM 20. The memory controller 50 acquires the patrol read execution time interval corresponding to the combination of the temperature, the intensity of the magnetic field, and the write/erase count from the patrol read information, and determines whether the elapsed time from the previous patrol read is larger than the patrol read execution time interval. If the elapsed time is larger than the patrol read execution time interval, the memory controller 50 executes the patrol read and if the elapsed time is smaller than the patrol read execution time interval, the memory controller 50 executes a separate background process. Therefore, if there is a temperature environment or a magnetic field environment or a write/erase count where an error due to the data retention is likely to occur, the frequency of executing the patrol read is increased as compared with the case of not matching such conditions. As a result, data loss due to an occurrence of an error due to data retention can be reduced. In addition, it is possible to reduce processing delay due to a request from the host while reducing data loss due to an occurrence of error by data retention by setting the frequency of the execution of the patrol read to such a degree as not to degrade the performance of the memory system 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a magnetoresistive random access memory (MRAM);
    a memory controller configured to control access of data to the MRAM;
    a temperature sensor configured to measure a temperature of the memory system; and
    a magnetic sensor configured to measure an intensity of a magnetic field of the memory system,
    wherein write/erase count information indicating a write/erase count of the MRAM, patrol read execution time information including a previous patrol read execution time, and patrol read information specifying a patrol read execution time interval for combinations of a temperature, an intensity of a magnetic field, and a write/erase count are stored in the MRAM, and
    wherein the memory controller is configured to:
        acquire the temperature from the temperature sensor,
        acquire the intensity of the magnetic field from the magnetic sensor,
        acquire from the patrol read information the patrol read execution time interval corresponding to the combination of the temperature, the intensity of the magnetic field, and the write/erase count, and
        determine whether or not a patrol read shall be executed by comparing the elapsed time from the previous patrol read execution time with the acquired patrol read execution time interval.

2. The memory system according to claim 1,
    wherein the memory controller is configured to execute the patrol read when the elapsed time is longer than the patrol read execution time interval.

3. The memory system according to claim 1,
    wherein the memory controller is configured to not execute the patrol read when the elapsed time is smaller than the patrol read execution time interval.

4. The memory system according to claim 2,
    wherein the memory controller is configured to execute a refresh process of correcting the error-containing data and writing the data in a separate location in the MRAM when there is an error in data of the MRAM as a result of execution of the patrol read.

5. The memory system according to claim 1,
    wherein the patrol read information is set such that as the temperature gets higher, the magnetic field gets stronger, or the write/erase count gets larger, the patrol read execution time interval gets smaller.

6. The memory system according to claim 2,
    wherein the patrol read information is set such that as the temperature gets higher, the magnetic field gets stronger, or the write/erase count gets larger, the patrol read execution time interval gets smaller.

7. The memory system according to claim 1,
    wherein the memory controller is configured to determine whether or not the patrol read shall be executed when a power supply of the memory system is turned on, or when an idle request from a host connected to the memory system is received.

8. The memory system according to claim 2,
    wherein the memory controller is configured to determine whether or not the patrol read shall be executed when a power supply of the memory system is turned on, or when an idle request from a host connected to the memory system is received.

9. The memory system according to claim 1, wherein the memory is configured to temporarily store the temperature and the intensity of a magnetic field, when the memory controller is determining whether or not a patrol read is to be executed.

10. The memory system according to claim 1,
    wherein the memory controller executes a separate background process when the memory controller determines that a patrol read is not to be executed.

11. A control method of a memory system comprising:
    storing in a magnetoresistive random access memory (MRAM) write/erase count information indicating the write/erase count of the MRAM, patrol read execution time information including the previous patrol read execution time, and patrol read information defining patrol read execution time intervals for combinations of a temperature, an intensity of a magnetic field, and a write/erase count;
    acquiring the temperature from a temperature sensor provided in the memory system;
    acquiring the intensity of a magnetic field from a magnetic sensor provided in the memory system;
    acquiring the write/erase count from the MRAM;
    acquiring the patrol read execution time information from the MRAM;
    acquiring from the patrol read information the patrol read execution time interval corresponding to the combination of the temperature, the intensity of the magnetic field, and the write/erase count; and
    determining whether or not a patrol read shall be executed by comparing the elapsed time from the previous patrol read execution time with the acquired patrol read execution time interval.

12. The method according to claim 11,
    wherein the patrol read is executed when the elapsed time is longer than the patrol read execution time interval.

13. The method according to claim 11,
    wherein the patrol read is not executed when the elapsed time is smaller than the patrol read execution time interval.

14. The method according to claim 12, further comprising executing a refresh process of correcting the error-containing data and writing the data in a separate location in the MRAM when there is an error in data of the MRAM as a result of execution of the patrol read.

15. The method according to claim 11,
    wherein the patrol read information is set such that as the temperature gets higher, the magnetic field gets stronger, or the write/erase count gets larger, the patrol read execution time interval gets smaller.

16. The method according to claim 12,
    wherein the patrol read information is set such that as the temperature gets higher, the magnetic field gets stronger, or the write/erase count gets larger, the patrol read execution time interval gets smaller.

17. The method according to claim 11, further comprising determining whether or not the patrol read shall be executed when a power supply of the memory system is turned on, or when an idle request from a host connected to the memory system is received.

18. The method according to claim 12, further comprising determining whether or not the patrol read shall be executed when a power supply of the memory system is turned on, or when an idle request from a host connected to the memory system is received.

19. The method according to claim 11, further comprising temporarily storing in the memory the temperature and the intensity of a magnetic field, when determining whether or not a patrol read is to be executed.

20. The method according to claim 11, further comprising executing a separate background process when it is determined that a patrol read is not to be executed.

\* \* \* \* \*